(12) United States Patent
Nair et al.

(10) Patent No.: US 7,405,364 B2
(45) Date of Patent: Jul. 29, 2008

(54) DECOUPLED SIGNAL-POWER SUBSTRATE ARCHITECTURE

(75) Inventors: Rajendran Nair, Gilbert, AZ (US); John Tang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 10/335,026

(22) Filed: Dec. 30, 2002
(Under 37 CFR 1.47)

(65) Prior Publication Data
US 2004/0124004 A1    Jul. 1, 2004

(51) Int. Cl.
*H05K 3/30* (2006.01)
*H05K 1/16* (2006.01)

(52) U.S. Cl. ......................... 174/260; 361/792; 439/66; 174/261; 29/832

(58) Field of Classification Search ................. 174/260, 174/261; 361/783, 792–795, 803; 439/66
See application file for complete search history.

(56) References Cited

U.S. PATENT DOCUMENTS

| | | | | |
|---|---|---|---|---|
| 5,136,471 A * | 8/1992 | Inasaka | ...................... | 361/794 |
| 5,450,290 A * | 9/1995 | Boyko et al. | ................. | 361/792 |
| 5,576,519 A * | 11/1996 | Swamy | ....................... | 174/265 |
| 5,633,479 A * | 5/1997 | Hirano | ....................... | 174/255 |
| 5,686,790 A * | 11/1997 | Curtin et al. | ................. | 313/493 |
| 5,847,936 A * | 12/1998 | Forehand et al. | ............ | 361/794 |
| 5,854,512 A * | 12/1998 | Manteghi | ..................... | 257/735 |
| 6,274,819 B1 * | 8/2001 | Li et al. | ...................... | 174/254 |
| 6,407,343 B1 * | 6/2002 | Tanaka | ........................ | 174/261 |
| 6,497,943 B1 * | 12/2002 | Jimarez et al. | .............. | 428/209 |
| 6,760,232 B2 * | 7/2004 | Smith et al. | .................. | 361/780 |
| 6,794,581 B2 * | 9/2004 | Smith et al. | .................. | 174/260 |
| 6,992,379 B2 * | 1/2006 | Alcoe et al. | .................. | 257/700 |
| 2002/0175669 A1 * | 11/2002 | Ziegner et al. | ................. | 324/95 |
| 2005/0129349 A1 * | 6/2005 | Tourne | ......................... | 385/14 |

* cited by examiner

*Primary Examiner*—Jeremy C Norris
(74) *Attorney, Agent, or Firm*—Marger Johnson & McCollom, P.C.

(57) ABSTRACT

A device comprises a substrate core having power paths through it and an input/output signal routing layer upon the core substrate. An integrated circuit may be arranged on the routing layer such that the integrated circuit is electrically coupled to the substrate core through the routing layer.

18 Claims, 6 Drawing Sheets

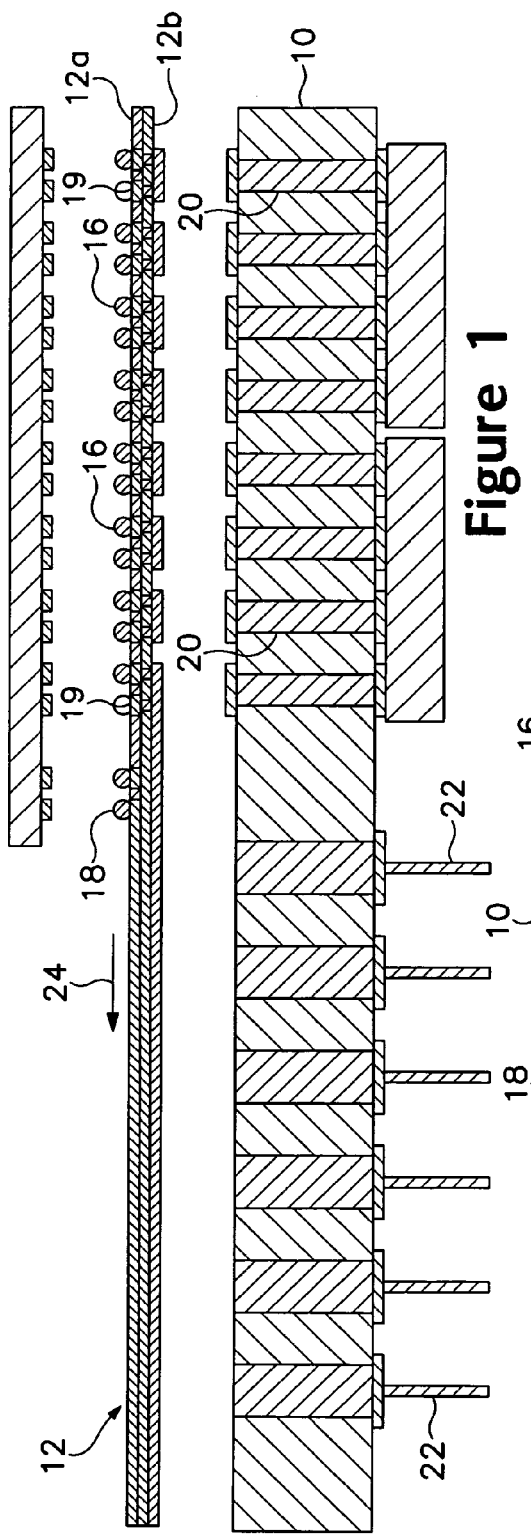
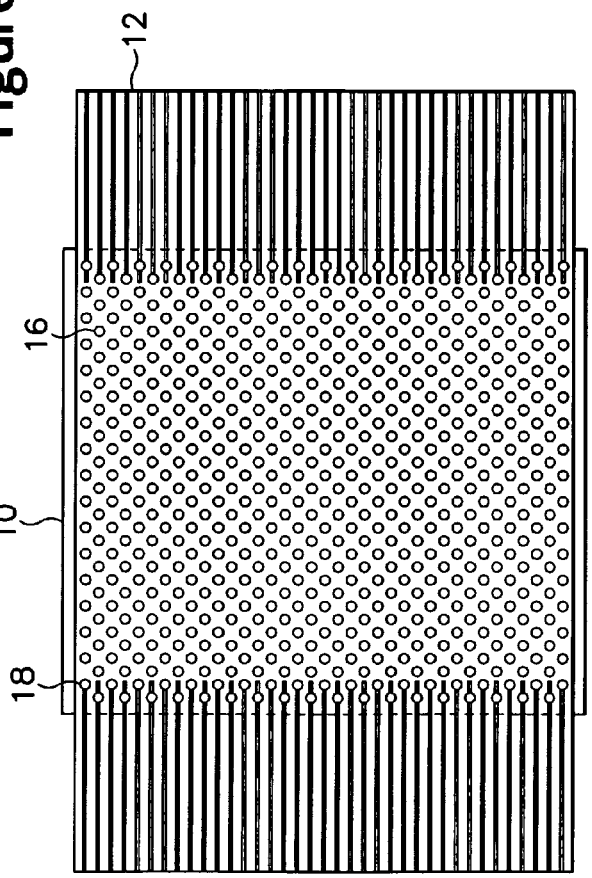
Figure 1
Figure 2

DECOUPLED SIGNAL-POWER SUBSTRATE ARCHITECTURE

BACKGROUND

As the speed and complexity of processors and other integrated circuit components has increased, the need for high-speed input/output (IO) has also increased. Conventional packaging technologies are running into physical limitation making them unable to meet all the requirements. New technologies, such as optical IO integrated on a die, are becoming a reality. Current manufacturing processes and designs have limited ability to adapt to these new technologies. Additionally, current conventional processing of integrated circuits uses the same substrate design structure for power delivery and for signal IO. Neither one of these can be optimized, either for performance versus cost or other factors, as some of the requirements of one area restricts the optimization of the other.

In addition, due to the increasing trends of higher current and high I/O count, using the same design structure drives a substantial increase in pin count, hence an increase in body size and package cost. Separating power and signal delivery paths may improve signal integrity due to less discontinuity, better impedance matching and reduction latency. At the same time, more pins can be dedicated for power delivery.

BRIEF DESCRIPTION OF THE DRAWINGS

Embodiments of the invention may be best understood by reading the disclosure with reference to the drawings, wherein:

FIG. 1 shows a cross section of an embodiment of an integrated circuit device package.

FIG. 2 shows a top view of an embodiment of an input/output routing layer of an integrated circuit substrate for a two-sided connection to another integrated circuit.

DETAILED DESCRIPTION OF THE EMBODIMENTS

Figure 3:
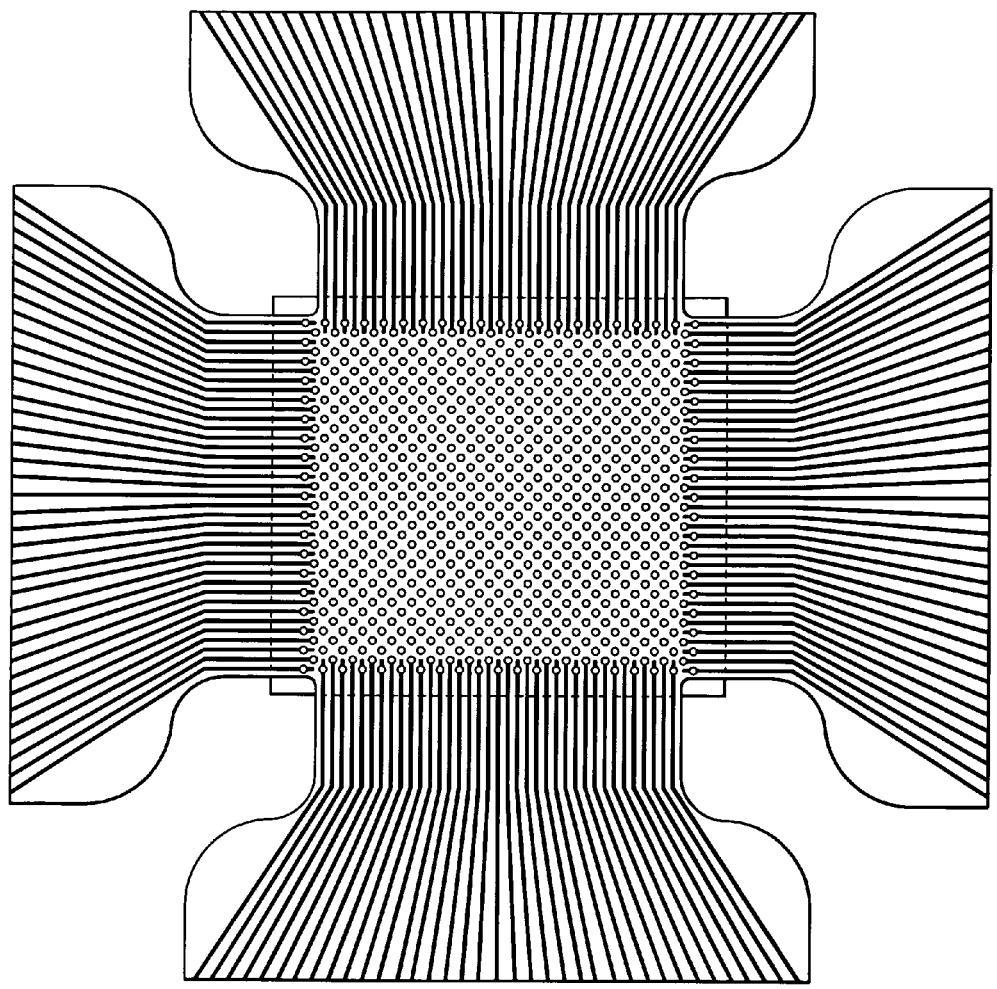
FIG. 3 shows a top view of an alternative embodiment of an input/output routing layer of an integrated circuit substrate for four-sided connections to other integrated circuits.

FIG. 1 shows an embodiment of an integrated circuit device package. A substrate core 10 has a design optimized for power delivery through the power paths 20 and the pins 22. It must be noted that pins of a pin grid array may also be replaced by a ball grid array, both would serve as package connectors. This is intended as an example as a means for better understanding of the invention and is not intended to limit application of embodiments of the invention. Any type of package connectors could be used.

A flex tape 12 is arranged on the substrate core to allow routing of the input/output (IO) signals and pass through vias for power delivery. In this embodiment the flex tape servers as an input/output signal routing layer. Vias and pads are provided on the two-layered flex tape to allow contact between the power delivery part integrated circuit die 14 and the power paths such as 20 through the solder balls 16. Solder ball 18 is in contact with the IO signaling components of the integrated circuit and allows routing of the IO signals in a direction perpendicular to the power paths, such as in the direction 24, where the signals are routed horizontally out from the edge of the silicon die. The routing layer may encompass newer IO technologies, such as optical waveguides or an optical routing, as well as electromagnetic signaling, acting as an electromagnetic routing layer.

This allows separation of the power delivery and IO signals, and avoids having to route the IO signals through the substrate core. This allows the power delivery design to be optimized without accounting for signal IO and reduces impedance mismatch and discontinuities in the IO signals. Alternative methods of power delivery through the core substrate could be used. In one embodiment, power delivery could be accomplished by integrated power delivery through the substrate, rather than through the power paths.

A top view of a substrate core 10 upon which is arranged a flex tape 12 is shown in FIG. 2. The flex tape 12 may have drilled and plated vias, through which the solder balls 16 and 18 make connection to the integrated circuit. Note that the solder ball 18 will rest on a trace that causes the signals from the IO portions of the circuit to route to the side. The solder ball 16 would provide connection for power delivery through the substrate core. In this manner, due to the depopulation of the signal pins, which no longer go through the substrate core, more pins are provided for power delivery, allowing better power delivery for a given package body size.

The flex tape 12 overhangs the substrate 10 to allow a connector to be connected to the flex tape in alignment with the traces that form the signal paths 13. This allows the IO signals to be routed on and off the device, and provides a high performance bus to connect to other devices.

As can be seen in FIG. 3, the fanning out of the signals allows the utilization of wider pitch/lower cost connectors. This may be for chip-to-chip connection or chip to motherboard connection through a mating connector. Power may be supplied through a conventional socket at the vertical power pathway.

Similarly, the materials of the flex tape would be selected to be conducive with high bandwidth signals. Typically, these materials would be low-loss and low-k, k being the average dielectric constant of the material. A low k material would be a material with a dielectric constant less than 3. A low loss material would have a loss tangent of less than 0.01. Referring back to FIG. 1, the flex tape 12 would typically have one or two layers. In the example of a two-layer flex tape, the top metal layer 12a would be the signal transmission layer to carry the signals, and the bottom layer 12b is used as a reference plane. A one-layer flex tape may comprise only layer 12b and may be a layer of dielectric material.

Figure 4A:
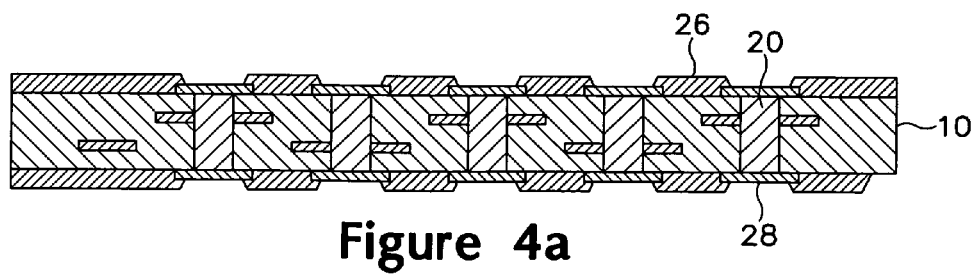
FIGS. 4a-4f show an embodiment of a manufacturing process for the decoupled signal-power substrate.

An embodiment of a method to manufacture a device using flex tape for signal IO is shown in FIGS. 4a-f. Each successive drawing will highlight the further processing being performed. In FIG. 4a, a conventional substrate core, such as a multi-layer laminate core, metal core or co-fired ceramic core is provided. The substrate core 10 has power paths 20, with corresponding contact power pads 26 and 28. The contact pad 26 may be referred to as the tape contact pad, as that is the side of the core with which the tape and the integrated circuit is connected. The contact pad 28 may be referred to as the pin contact pad, as that will be the side with which the pins come into contact. Note that a ball grid array could just as easily be used, and the use of pins is only as an example.

Figure 4B:
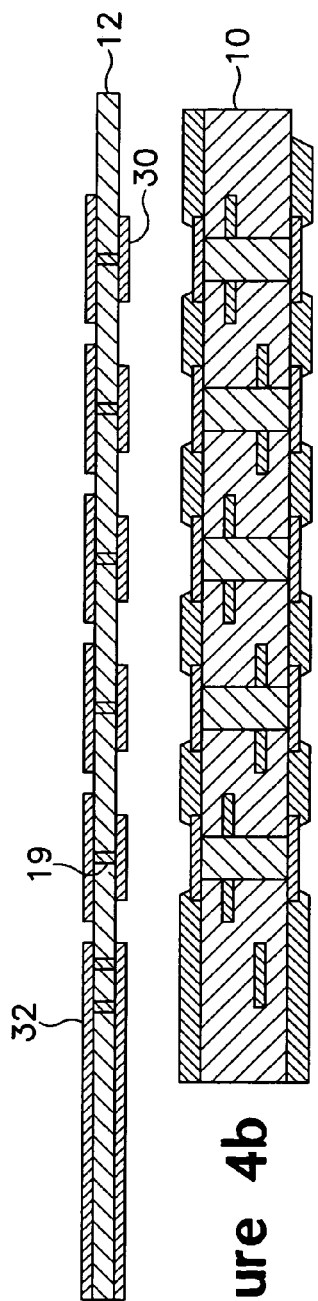

In FIG. 4b, the flex tape 12 is a conventional 2 layer flex tape. An example of such a flex tape material is polyimide. Contact power pads, such as 30, are arranged on the flex tape to match the contact pads on the substrate core. Vias 19 are provided in the tape to allow transmission of power through the tape. IO signals are routed horizontally on the top side of the tape such as through contact pad 32.

Figure 4C:
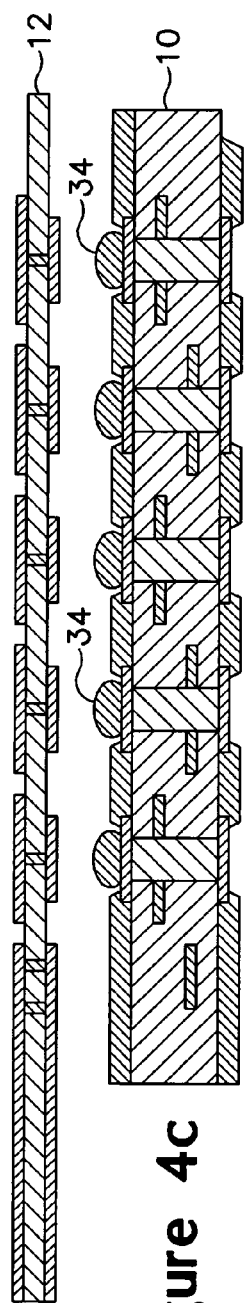
Figure 4D:
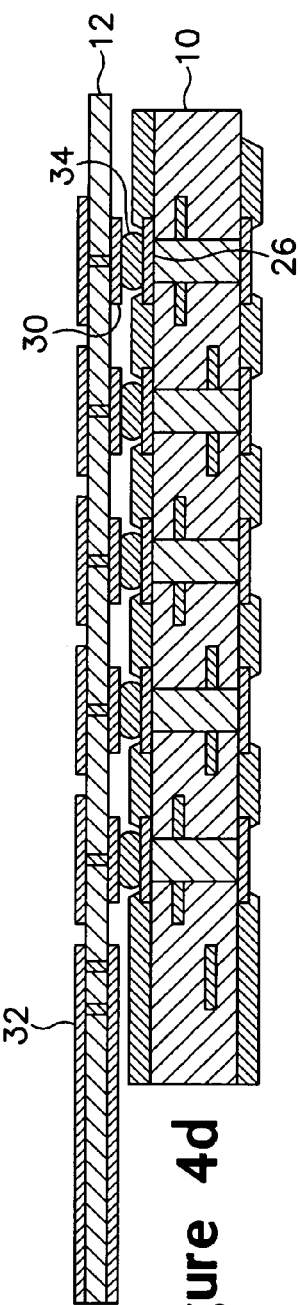

In FIG. 4c, conductive paste or solder 34 is applied to the matching pads on the contact pads. This ensures connection between the power paths and the matching pads on the substrate core and the flex tape contact pads. The flex tape is then laminated onto the core in 4d. Note that connection is now made between the contact pads on the flex tape, such as 30, and the contact pads on the substrate core, such as 26, through the paste 34. There is no connection between the signaling paths 32 and the substrate core 10.

Figure 4E:
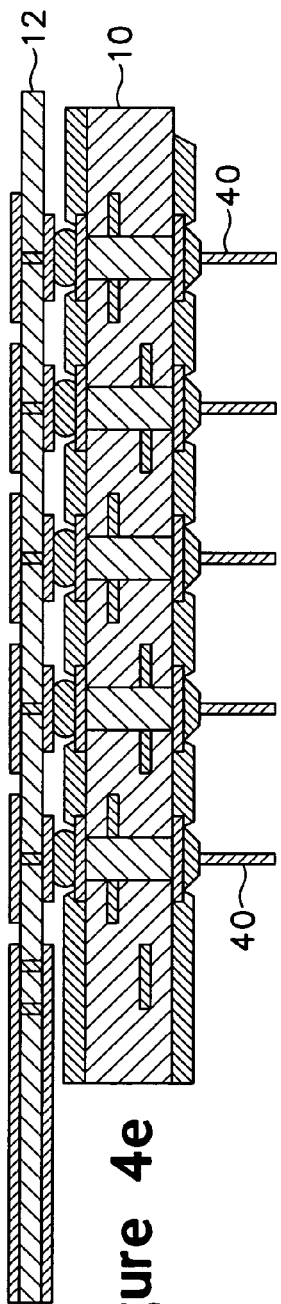
Figure 4F:
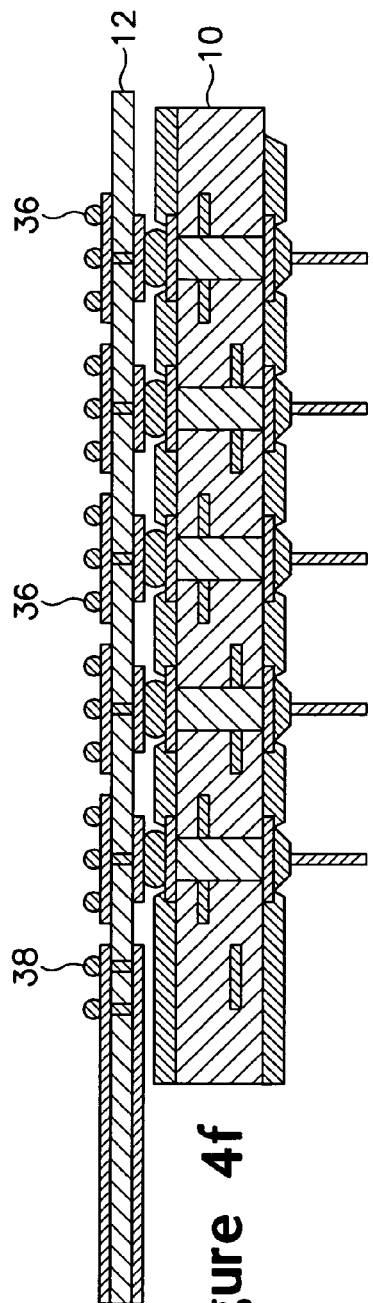

In FIG. 4e, the pins 40 are attached. In FIG. 4f, the solder balls upon which the integrated circuit will rest are applied. Note that the solder balls, such as 36, are connected to the power delivery part of the silicon die. Solder ball 38 provides connection only to the signal part of the silicon die. In this manner, a flexible tape could be added into standard package manufacturing processes with minimal extra processing.

Figure 5A:
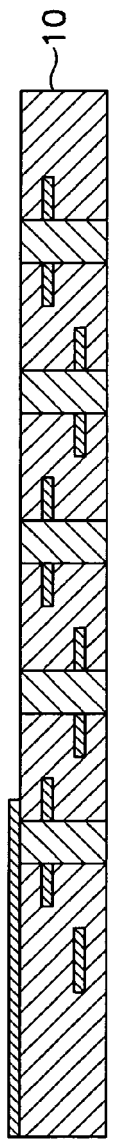
FIGS. 5a-d show an alternative embodiment of a manufacturing process for the decoupled signal-power substrate.
Figure 5B:
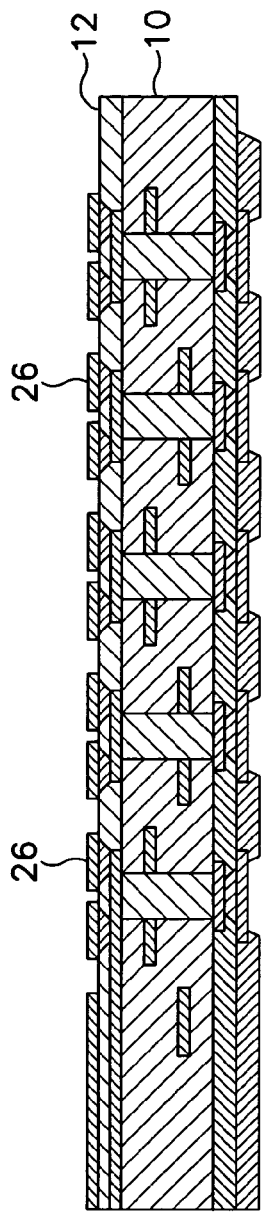

In an alternative embodiment, a top signal layer is applied in a buildup process. In FIG. 5a, as in FIG. 4a, a convention substrate core 10 is provided. In FIG. 5b, a top layer of a dielectric material is provided. The top layer may be a dry dielectric film, such as ABF™ manufactured by Ajinomoto, Inc. The film 12 may come in roll form and be laminated onto the substrate using epoxy. The film may be referred to as laminate tape to differentiate it from the flex tape discussed above. The dielectric film may be low dielectric and low loss.

After lamination the film is drilled with a laser to form the microvias. The film is then lithographically processed to expose the areas that need plating, and then copper plated to form the interconnections and the resist from the lithographic process is removed. Also as part of this process, the contact pads, such as 26, are formed.

Figure 5C:
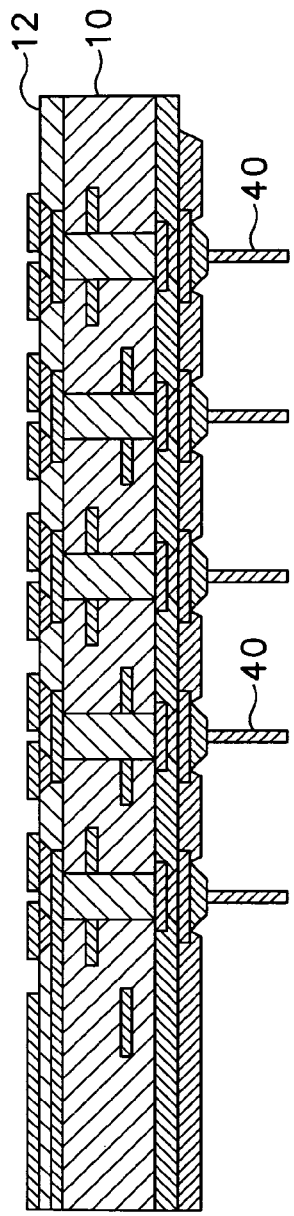
Figure 5D:
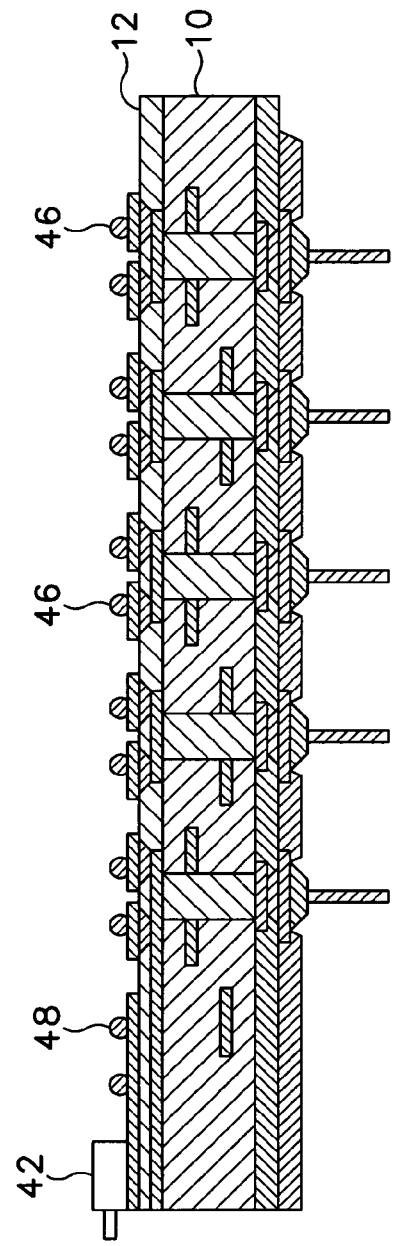

FIG. 5c shows the addition of the pins such as 40 to the package. In FIG. 5d, the solder balls for the power connection, such as 46, and the solder balls, such as 48, for the signal connections are applied. In addition, a connector 42 may be mounted on the top layer to allow the transmission of signals to and from the routing layer formed by the laminate tape.

Figure 6:
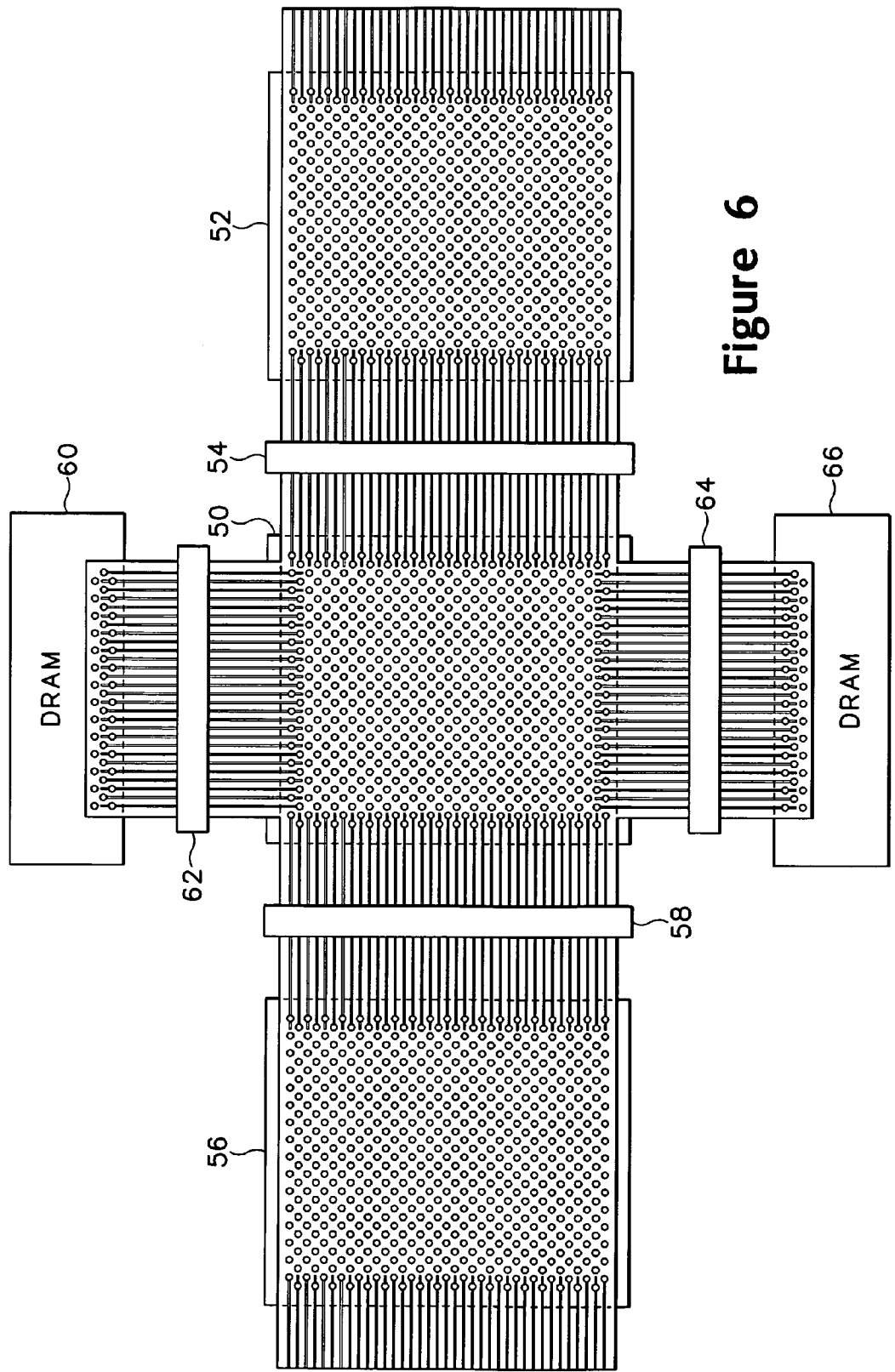
FIG. 6 shows a top view of an embodiment of an electronics system using a routing layer for communication between devices.

FIG. 6 shows an electronic system with routing layers used to provide electrical coupling for communication between devices. A component 50 has four-sided fan out of signals. A first routing layer extends from component 50. A second component 52 has a second routing layer to which the first routing layer is electrically coupled by connector 54.

Similarly, a third component 56 has a third routing layer electrically coupled to the first routing layer by a connector 58. In this particular embodiment, two dynamic random access memories (DRAM) 60 and 66 have fourth and fifth routing layers, electrically coupled to the first routing layer by connectors 62 and 64, respectively. The routing layer provides I/O signaling communications between devices, decoupling those signals from the power delivery.

In addition to the advantages already discussed, other alterations to the manufacturing process made possible by the use of the flex tape may prove advantageous. For example, by moving the signal routing from the substrate core to the flex tape, the patterning used for the power pathways may be different from the patterning used for the signal layer. Bump pitch scaling and fine line widths for high IO signal count could be enabled through advanced patterning technologies on the flex tape. Meanwhile, a coarser patterning technology would suffice for the power paths. All of the layers of the substrate package do not have to be processed with the more expensive fine-pitch technology equipment.

The tape material will be inherently more flexible than typical organic build-up layers currently in use. This may minimize the stresses on the mechanically weak silicon using ultra low k dielectric. In addition, the material being more compliant and flexible may lead to an overall more structurally sound package.

Thus, although there has been described to this point a particular embodiment for a method and apparatus for power and IO signal separation in integrated circuit device manufacturing, it is not intended that such specific references be considered as limitations upon the scope of this invention except in-so-far as set forth in the following claims.

What is claimed is:

1. A device, comprising:
   a core substrate having a first and second surface with power paths penetrating the core from the first surface to the second surface, the core substrate not including signal paths;
   a flexible tape arranged on the first surface of the core substrate, the flexible tape having no more than two layers including a routing layer on a top surface of the flex tape to route signals in a signal path and vias to allow power connections to be made to the power paths through the core substrate, the signal path perpendicular to the power paths;
   contacts on a surface of the flexible tape to allow mounting of an integrated circuit, wherein the contacts comprise power contacts and signal contacts; and
   package connectors on the second surface of the core substrate to allow the device to be mounted on a printed circuit substrate.

2. The device of claim 1, wherein the flexible tape comprises one selected from an optical routing layer and a two layer flexible tape.

3. The device of claim 1, wherein the contacts comprises solder balls.

4. The device of claim 1, wherein the package connectors comprise pins.

5. The device of claim 1, wherein the printed circuit substrate comprises a printed circuit board.

6. A method, comprising:
   providing a core substrate having first and second surfaces, wherein the core substrate has power paths penetrating the substrate from a first substrate to a second substrate;
   forming first set of contacts on the substrate on the first surface;
   forming a second set of contacts on the substrate on the second surface;
   connecting a flexible tape to the first set of contacts to provide a routing layer, the flexible tape having no more than two layers, including a top layer as the routing layer to route signals in a signal path only perpendicular to the power paths;
   connecting package connectors to the second set of contacts to connect the package connectors to the power paths;
   connecting an integrated circuit die to the flexible tape; and
   connecting the package connectors to a printed circuit board.

7. The method of claim 6, wherein connecting package connector further comprise connecting pins to the second set of contacts to allow the package connectors to be mounted to a printed circuit board.

8. The device of claim 1, wherein the power contacts provide connection for power delivery through the core substrate.

9. The device of claim 1, wherein the signal contacts are in contact with IO signaling components of the integrated circuit.

10. The device of claim 1, wherein the device avoids routing IO signals through the core substrate.

11. The device of claim 1, further comprising a connector connected to the flexible tape in alignment with the signal path.

12. The device of claim 1, wherein the flexible tape comprises low-loss and low-k materials.

13. The device of claim 12, wherein the flexible tape comprises polyimide.

14. The device of claim 2, wherein the two-layer flexible tape comprises a top metal layer and a reference layer, the top metal layer transmitting signals.

15. The method of claim 6, further comprising arranging contact pads on the flexible tape, the contact pads matching the first set of contacts.

16. The method of claim 6, further comprising providing vias in the flexible tape to allow transmission of power through the flexible tape.

17. The method of claim 6, further comprising applying contacts on a surface of the flexible tape to allow mounting of the integrated circuit die, wherein the contacts comprise power contacts and signal contacts.

18. The method of claim 6, further comprising avoiding routing signals through the core substrate.

* * * * *